Figure 1A:
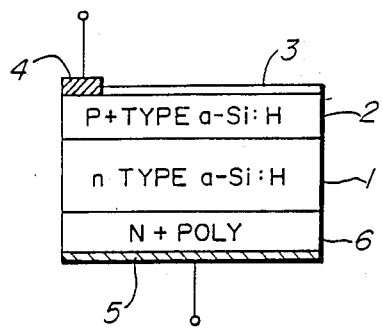

United States Patent [19]

Aktik

[11] Patent Number: 4,965,212
[45] Date of Patent: Oct. 23, 1990

[54] OPTICAL SENSOR
[75] Inventor: Metin Aktik, Bromont, Canada
[73] Assignee: Mitel Corporation, Ontario, Canada
[21] Appl. No.: 386,623
[22] Filed: Jul. 31, 1989

Related U.S. Application Data

[60] Division of Ser. No. 284,818, Dec. 14, 1988, Pat. No. 4,866,499, which is a continuation of Ser. No. 908,666, Sep. 17, 1986, abandoned.

[30] Foreign Application Priority Data

Mar. 24, 1986 [CA] Canada .................. 504872

[51] Int. Cl.⁵ .......................................... H01L 31/18
[52] U.S. Cl. .......................................... 437/4; 357/30
[58] Field of Search .................. 437/2, 4; 357/30 K, 357/30 P, 30 R, 30 M, 32

[56] References Cited

U.S. PATENT DOCUMENTS

| | | | |
|---|---|---|---|
| 3,604,987 | 9/1971 | Assour | 357/32 |
| 3,902,066 | 8/1975 | Roosild et al. | 357/32 |
| 4,246,043 | 1/1981 | Lindmayer | 357/52 |
| 4,485,389 | 11/1984 | Ovshinsky et al. | 357/30 |
| 4,517,733 | 5/1985 | Hamano | 437/2 |
| 4,633,031 | 12/1986 | Todorof | 357/30 |
| 4,698,495 | 10/1987 | Kajiwara | 357/2 |
| 4,724,323 | 2/1988 | Fukaya et al. | 357/30 |
| 4,894,700 | 1/1990 | Nobue et al. | 357/30 |

OTHER PUBLICATIONS

"Progress in amorphous-silicon photovoltaic-device research"; Brebner et al.; 1984; Département de physique, université de Montréal; Canada.
"High Efficiency a-Si:H Mis Solar Cells"; Aktik et al.; Département de génie physique; Ecole Polytechnique, Montréal; Canada.

Primary Examiner—Olik Chaudhuri
Assistant Examiner—Trung Dang
Attorney, Agent, or Firm—Antonelli, Terry, Stout & Kraus

[57] ABSTRACT

A photosensitive diode element and method of manufacture. The diode element is comprised of a first layer of n-type hydrogenated amorphous-silicon forming a cathode, and a second layer of p+ type material forming an anode, the second layer overlying the first layer and being transparent to optical energy. As a result of using hydrogenated amorphous-silicon, the photosensitive diode element according to the present invention has characteristics of high photoconductivity, controllably variable optical gap, and thin film structure. A photosensitive diode array formed from the subject diode elements is easily fabricated, employs straightforward circuitry for addressing each diode element, and is characterized by low crosstalk between elements, maximized optical sensitivity and broad dynamic range.

9 Claims, 2 Drawing Sheets

OPTICAL SENSOR

This is a divisional of application Ser. No. 07/284,818, filed Dec. 14, 1988 now U.S. Pat. No. 4,866,499, which is a continuation application of Ser. No. 06/908,666, filed Sept. 17, 1986, now abandoned.

This invention relates in general to photosensitive devices, and more particularly to a photosensitive diode element comprised of hydrogenated amorphous-silicon.

Modern day opto-electronic research has resulted in numerous developments utilizing photosensitive devices. Considerable research has been undertaken in developing photosensitive or photovoltaic arrays comprised of a plurality of such photosensitive detectors. Photosensitive arrays have numerous applications in the fields of telecommunications (e.g. optical fibers and integrated optics or image transmitting devices), domestic video processing (e.g. solid state cameras), and industrial applications (e.g. photocopying and facsimile equipment).

Prior art photosensitive arrays typically utilized Charge Coupled Devices (CCDs) built on crystalline silicon. Such arrays are characterized by complex structures which result in small photosensitive surface areas, and typically require a large number of processing steps for fabrication. Also, the sensitivity of CCD arrays has been found to be poor for short wavelengths of light (blue and ultraviolet). Numerous additional disadvantages of CCD arrays have been identified, as follows; the requirement for complex clock control circuitry, limited dynamic range, limited spectral and illumination intensity sensitivity, susceptibility to crosstalk between adjacent elements, saturation due to a low maximum of admissible light intensity, lack of linearity in response to illumination and compensation problems for overcoming high dark current.

According to the present invention, there is provided a photosensitive diode element fabricated from hydrogenated amorphous-silicon (a—Si:H) which overcomes the various disadvantages of prior art CCD devices discussed above. Hydrogenated amorphous-silicon is a semiconductor material having very high photoconductivity, typically in the vicinity of $10^4$. Depending upon the fabrication process utilized, the optical gap for a—Si:H is variable between 1.5 eV and 2.2 eV, whereas the optical energy gap for crystalline silicon is constant, in the vicinity of 1.1 eV. Consequently, the sensitivity of hydrogenated amorphous silicon to various light wavelengths can be tuned for optimum performance under specific lighting conditions.

As a result of its amorphous structure, the optical absorption properties of a—Si:H are superior to those of crystalline silicon from which prior art CCD elements were typically fabricated. Approximately one hundred times thinner films are required to absorb a predetermined quantity of light visible range when utilizing a—Si:H than when utilizing crystalline silicon. For example, a 1 micron thick layer of a—Si:H will absorb approximately 95% of visible light, whereas an approximately 100 micron thick layer of crystalline silicon would be required to achieve the same amount of absorption.

As a result of the requirement for only a relatively thin film to fabricate a photosensitive element utilizing hydrogenated amorphous-silicon, high efficiency photosensitive arrays may be fabricated therefrom. Metallization contacts can be disposed on the underside of each element resulting in isolation of array elements and straightforward access or addressing of each element.

Figure 1B:
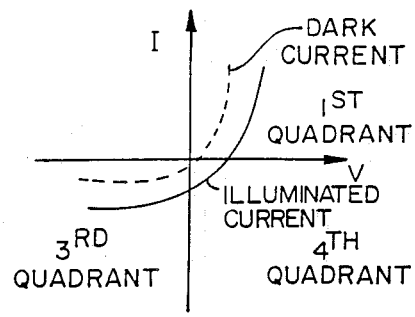
Figure 1C:
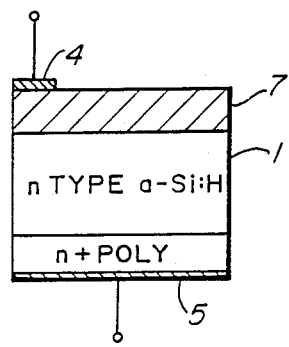
Figure 2:
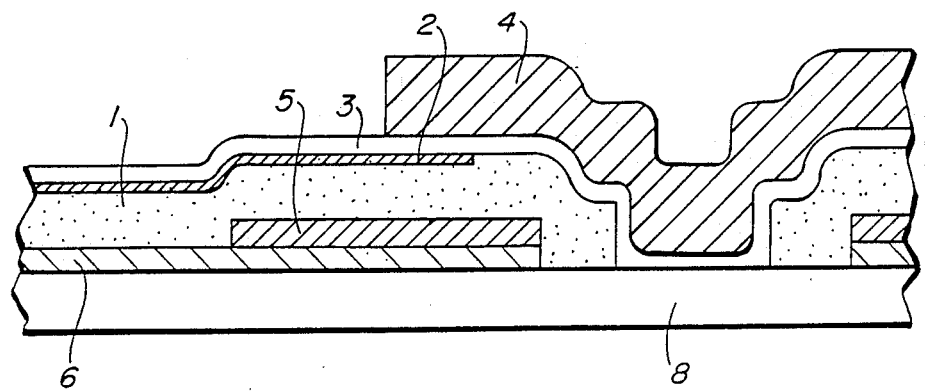
Figure 3:
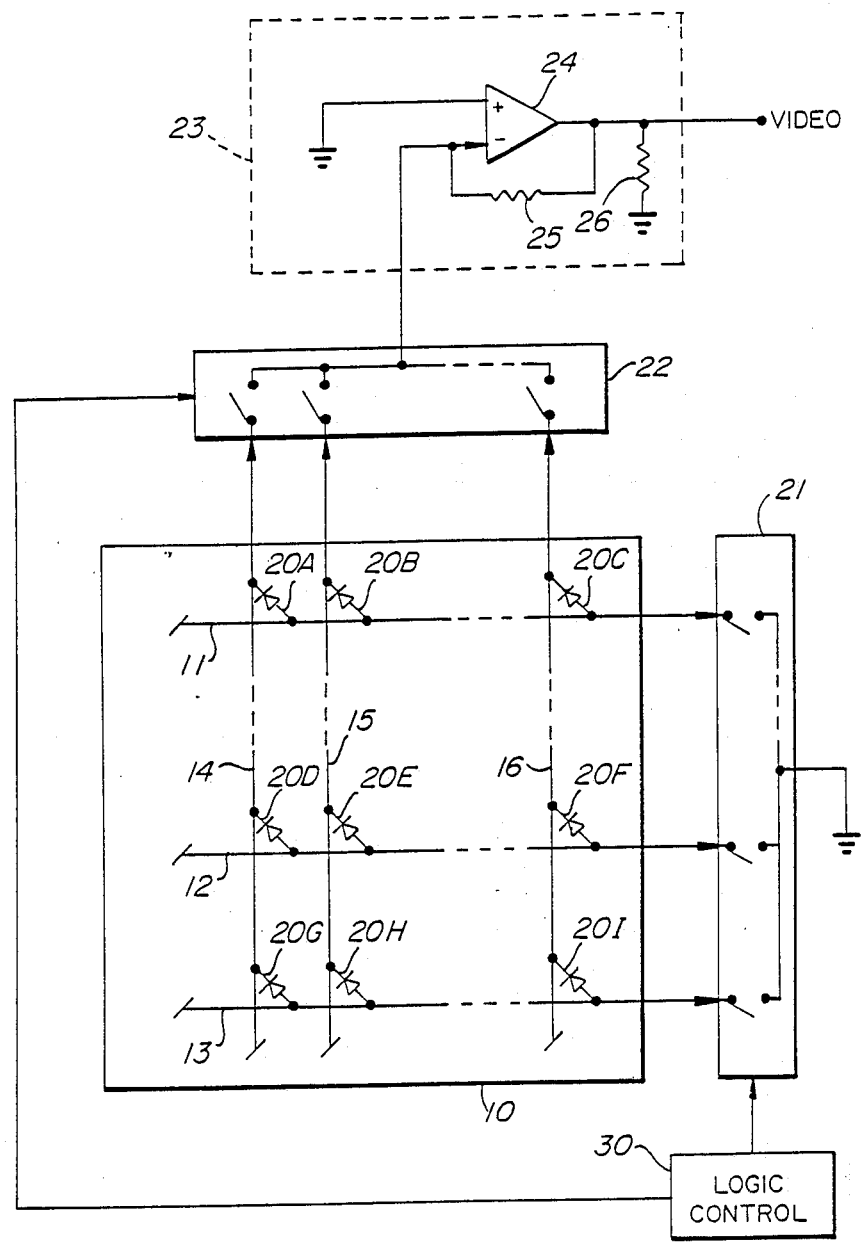

A better understanding of the invention will be obtained with reference to the detailed description below in conjunction with the following drawings, in which:

FIG. 1A is a simplified cross sectional view of a photosensitive diode element according to a first embodiment of the present invention in its most general form, FIG. 1B is a simplified graph of the I-V characteristic of the diode element illustrated in FIG. 1A, FIG. 1C is a simplified cross sectional view of a photosensitive diode element according to a second embodiment of the present invention, FIG. 2 is a detailed cross sectional view of a photosensitive diode element according to a preferred embodiment of the present invention, and FIG. 3 is a block schematic diagram of a photosensitive diode array comprised of photosensitive diode elements according to the present invention.

With reference to FIG. 1A, a photosensitive diode element is illustrated, comprised of a cathode 1 fabricated from n-type hydrogenated amorphous-silicon, and an anode 2 of p+ type hydrogenated amorphous-silicon, preferably implanted in the n-type cathode by well known means of ion implantation, etc.

A layer of pyroglass 3 provides a transparent coating over the p+ type anode 2 and an external contact 4 is connected to the anode 2 through the pyroglass layer 3.

A contact 5 is disposed underneath the diode element and connected to cathode 1 via a highly doped layer of n+ polysilicon 6, forming an ohmic contact between the cathode and metal comprising the contact 5.

It is well known from semiconductor electronic theory that current flows across a p—n junction due to drift of minority carriers generated thermally within a diffusion length of each side of the junction. The minority carriers (e.g. electrons and holes) diffuse to the transition region surrounding the junction and are swept thereacross via the junction electric field. In the event the junction is illuminated by photons having energy greater than the gap energy ($E_g$) of the semiconductor material, an additional current flows due to Electron Hole Pair (EHP) generation.

Accordingly, in the event there is an open circuit across the photosensitive diode element illustrated in FIG. 1A, and the anode 2 and cathode 1 are exposed to illumination through pyroglass layer 3, optical generation of minority carriers results in an open circuit voltage developing between contacts 4 and 5. As the minority concentration is increased by optical generation of EHPs, the open circuit voltage increases until it reaches a limit equal to the equilibrium contact potential which is the maximum forward bias which may appear across the junction. The appearance of a forward voltage across an illuminated junction is known as the photovoltaic effect.

Depending upon the intended application, the photosensitive diode element of FIG. 1A can be operated in either of the third or fourth quadrants of its I-V characteristic, as shown in FIG. 1B. In the fourth quadrant, the junction voltage is positive and the current is negative across the diode element as a result of the aforementioned optically generated current. In this case, power is delivered by the element in proportion to the amount of illumination. The generated power can be applied to external circuitry connected to contacts 4 and 5.

FIG. 1C illustrates a further embodiment wherein a Schottky barrier is formed by depositing a layer of transparent metal 7, such as gold, aluminum, chromium or platinum over the n-type layer of a—Si:H, as an alternative to ion implantation of a p+ anode. In all other respects the embodiment of FIG. 3 functions substantially as described above with reference to FIGS. 1A and 1B.

With reference to FIG. 2, a detailed cross sectional view of a photosensitive diode element according either of FIGS. 1A or 1C, is shown in detail.

According to the preferred method of fabrication, a first layer of pyroglass (oxide) 8 is deposited to a thickness of approximately 0.8 microns. Subsequently, the aforementioned layer of n+ polysilicon 6 is deposited to a thickness of approximately 0.3 microns. The layer of n+ polysilicon 6 is then masked and etched according to well known techniques.

Next, the first layer of metallization 5 (metal I) is deposited to a thickness of approximately 0.3 microns and subsequently masked and etched. The deposited layers, to an external cathode contact point (not shown) for connection externally of the diode element. Metallization layer 5 permits end-point detection during etching of the amorphous-silicon layer 1 in order to stop etching at the polysilicon surface.

The cathode layer of n-type hydrogenated amorphous-silicon 1 is then deposited to a thickness of preferably 0.8 microns, and subsequently masked and etched, wherein metallization layer 5 functions as an etch-stop barrier.

The next fabrication step comprises establishing a p+ type layer 2 over the n-type cathode 1, thereby forming an anode. As discussed above with reference to FIGS. 1A and 1C, the anode layer may be implanted via well known ion implantation techniques or alternatively a thin transparent metallization layer may be deposited on top of the cathode layer 1, forming a Schottky p—n barrier, and then masked and etched. In any event, the anode layer is preferably of approximately 0.01 microns in thickness. The Schottky type structures are preferred when higher blue and ultraviolet sensitivities are required.

A layer of pyroglass 3 is deposited over the entire profile of previous layers, to a thickness of approximately 0.2 microns, and a contact mask and etching step is then performed for contacting the p+ type anode layer.

The purpose of pyroglass layer 3 is to passivate the diode element, i.e. protect it against moisture, corrosion, etc. The pyroglass layer 3 also functions as an antireflecting coating for maximum light transmission to the device. According to the theory of multilayer films, the reflectance R of a quarter-wave film such as provided by layer 3, is given by:

$$R = \left( \frac{n_t - n_1^2}{n_t + n_1^2} \right)^2$$

where $n_t$ and $n_l$ are the refractive indices of the substrate layer and the antireflective quarter-wave film, respectively. According to a successful prototype of the present invention, for a wavelength of approximately 0.7 $\mu$m, the pyroglass layer 3 was required to be approximately 0.18 $\mu$m thick; where $n_t \approx 1.87$ and $n_l \approx 1.5$.

Lastly, an anode metallization layer 4 is deposited over the pyroglass layer 3 to a layer of approximately 0.8 microns and connects the p+ type anode layer through the aforementioned contact mask. The final metallization layer 4 is patterned to form a series of openings for exposing the hydrogenated amorphous-silicon layers to illumination.

Preferably, a plurality of the photosensitive diode elements of FIG. 2 are fabricated on a single chip to form an array or matrix as illustrated with reference to FIG. 3.

A photosensitive diode array 10 is shown comprised of a plurality of row conductors 11, . . . 12, 13, a plurality of column conductors 14, 15, . . . 16 and a plurality of diodes 20A-20I, etc., disposed at the intersections of respective ones of the row and column conductors. Each of the row conductors corresponds to a metallization layer 4 as discussed above with reference to FIG. 2, while the column conductors correspond to metallization layer 5.

A plurality of row contact switches 21 are connected to respective ones of the row conductors 11, . . . 12, 13 and to ground. Similarly, a further plurality of switches 22 are connected to respective ones of the column conductors 14, 15, . . . 16 and to the input of a detector circuit 23.

Detector circuit 23 is preferably comprised of a differential amplifier 24 having an inverting input thereof connected to a node connecting a common terminal of each of the plurality of switches 22, and a non-inverting input thereof connected to ground. A feedback resistor 25 is connected between an output of differential amplifier 24 and the inverting input thereof, and an output resistor 26 is connected from the output of the differential amplifier 24 to ground. Also, the output of amplifier 24 is connected to a VIDEO output terminal for carrying a generated video output signal.

In a successful prototype of the array, feedback resistor 25 and output resistor 26 were 1M ohm and 50 ohm resistors, respectively.

A logic control circuit 30 is connected to the row and column switches 21 and 22 respectively, for closing successive pairs of row and column switches, thereby addressing individual ones of the diode elements.

In operation, upon closure of a predetermined pair of row and column switches, a predetermined one of the diode elements 20A-20I, is addressed such that the anode terminal thereof is connected to ground via a corresponding one of switches 21 and the cathode terminal is connected to detector 23 via a corresponding one of switches 22.

The amount of optically generated current is measured by the detector 23, wherein the current is proportional to the amount of light absorbed by the addressed diode element. Successive ones of the diode elements are addressed via control circuit 30 such that a video output signal is generated via detector 23 corresponding to the amount of light impinging upon the various elements of diode array 10.

In summary, the photosensitive diode element according to the present invention and the resulting array made therefrom, are characterized by simple fabrication and structure, straightforward addressing of each element via, for instance, shift registers, and a wide dynamic range (typically in the vicinity of 1:10,000). In addition, the blue and ultraviolet sensitivity of a—Si:H has been found to be superior to crystalline silicon. The maximum sensitivity to various frequencies can be tuned and the light sensitive surface of each element can be maximized for a given element geometry as a result of patterning metallization layer 4 to accommodate a plurality of openings, and extending metallization layer 5 underneath the element.

Elements in array 10 are typically isolated as shown in FIG. 2, thereby overcoming the problem of crosstalk between adjacent elements characteristic of prior art CCD devices. The photosensitive diode element as utilized in array 10 operates in a current mode wherein the diode is loaded, resulting in very linear response.

A person skilled in the art understanding the present invention may conceive of alternative embodiments or modifications therein. All such modifications are believed to be within the sphere and scope of the present invention as defined by the claims appended hereto.

I claim:

1. A method of fabricating a photosensitive diode element, comprising the steps of:
   (a) depositing and etching a first conductive layer over an insulating substrate,
   (b) depositing over said first conductive layer and said substrate, and etching, a layer of n-type hydrogenated amorphous silicon to form a cathode portion of said diode element,
   (c) implanting p+ material into predetermined portions of said n-type layer, the predetermined portions being sufficiently thin to allow optical energy to pass therethrough, to form an anode portion of said diode element,
   (d) depositing a further conductive layer, and etching said further conductive layer for connection to said p+ implanted portions along an edge of and over said p+ implanted portions, and
   (e) forming connections from said first and further conductive layers to external cathode and anode contacts, respectively.

2. A method as defined in claim 1, in which the step of etching the first conductive layer restricts it to a path along the edge of the diode element, and further comprising the step of depositing and etching a layer of n+ polysilicon on said substrate prior to depositing said first conductive layer, thereby forming an ohmic content between said first conductive layer and said n-type silicon layer.

3. A method of fabricating a photosensitive diode element, comprising the steps of:
   (a) depositing and etching a first conductive layer over an insulating substrate,
   (b) depositing over said first conductive layer and said substrate, and etching, a layer of n-type hydrogenated amorphous silicon to form a cathode portion of said diode element,
   (c) depositing a layer of metal over said n-type layer, the layer of metal being sufficiently thin to allow optical energy to pass therethrough, to form an anode portion of said diode element and a Schottky barrier with the n-type hydrogenated amorphous silicon layer.
   (d) depositing a further conductive layer, and etching said further conductive layer for connection to said layer of metal along an edge of and over said layer of metal, and
   (e) forming connections from said first and further conductive layers to external cathode and anode contacts, respectively.

4. A method as defined in claim 1, including the further step, prior to said forming connections, of depositing a layer of pyroglass over exposed portions of previously deposited layers, and connecting said external cathode and anode contacts through said pyroglass to said first and further conductive layers.

5. A method as defined in claim 2, including the further step, prior to said forming connections, of depositing a layer of pyroglass over exposed portions of previously deposited layers, and connecting said external cathode and anode contacts through said pyroglass to said first conductive and further conductive layers.

6. A method as defined in claim 3, including the further step, prior to said forming connections, of depositing a layer of pyroglass over exposed portions of previously deposited layers, and connecting said external cathode and anode contacts through said pyroglass to said first conductive and further conductive layers.

7. A method as defined in claim 1, including the further step, prior to said forming connections, of depositing a transparent passivating layer over exposed portions of previously deposited layers, and connecting said external cathode and anode contacts through said passivating layer to said first and further conductive layers.

8. A method as defined in claim 2, including the further step, prior to said forming connections, of depositing a passivating layer over exposed portions of previously deposited layers, and connecting said external cathode and anode contacts through said passivating layer to said first conductive and further conductive layers.

9. A method as defined in claim 3, including the further step, prior to said forming connections, of depositing a passivating layer over exposed portions of previously deposited layers, and connecting said external cathode and anode contacts through said passivating layer to said first conductive and further conductive layers.

* * * * *